(12) United States Patent
Tang et al.

(10) Patent No.: US 8,384,427 B1
(45) Date of Patent: Feb. 26, 2013

(54) CONFIGURING MULTIPLE PROGRAMMABLE LOGIC DEVICES WITH SERIAL PERIPHERAL INTERFACES

(75) Inventors: Howard Tang, San Jose, CA (US);
Roger Spinti, Milpitas, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 12/752,455

(22) Filed: Apr. 1, 2010

(51) Int. Cl.
*H03K 19/177* (2006.01)
*G11C 8/00* (2006.01)

(52) U.S. Cl. .............................. 326/39; 326/38; 326/40

(58) Field of Classification Search ............... 326/38–47
See application file for complete search history.

(56) References Cited

U.S. PATENT DOCUMENTS

| | | | |
|---|---|---|---|
| 5,635,855 A | 6/1997 | Tang | |
| 5,751,163 A | 5/1998 | Tang et al. | |
| 5,794,033 A * | 8/1998 | Aldebert et al. | 713/100 |
| 6,900,659 B2 * | 5/2005 | Goldfinch | 326/41 |
| 7,095,247 B1 | 8/2006 | Tang et al. | |
| 7,265,578 B1 | 9/2007 | Tang et al. | |
| 7,378,873 B1 * | 5/2008 | Tang et al. | 326/41 |
| 7,397,272 B1 | 7/2008 | Wennekamp | |
| 7,397,274 B1 | 7/2008 | Tang et al. | |
| 7,554,357 B2 | 6/2009 | Chen et al. | |
| 7,570,078 B1 | 8/2009 | Tang et al. | |
| 7,631,223 B1 | 12/2009 | Spinti et al. | |

OTHER PUBLICATIONS

"LatticeECP3 sysCONFIG Usage Guide," Technical Note 1169, Jan. 2010, published at www.latticesemi.com.
TAPP, "Configuring Xilinx FPGAs with SPI Serial Flash," XAPP951 (v1.2) Jan. 29, 2009, published at www.xilinx.com.
"Serial Peripheral Interface Master in MAX II CPLDs," Application Note 485, version 1.0, Dec. 2007, published at www.altera.com.
"Configuring Cyclone II Devices," Cyclone II Device Handbook, vol. 1, Section 1, Chapter 13, Feb. 2007, published at www.altera.com.

* cited by examiner

*Primary Examiner* — Crystal L Hammond

(57) ABSTRACT

In one embodiment, a programmable logic device includes configuration memory, an SPI port for receiving a bitstream, a chip select output pin, and configuration control circuitry. The chip select output pin can provide a chip select signal having a first logic state for selecting another device (such as another PLD) to receive a bitstream and a second logic state for de-selecting the other device. The configuration control circuitry is responsive to a command embedded in the received bitstream to drive the chip select output pin from the second logic state to the first logic state, thereby selecting the other device to receive the bitstream. Several such PLDs connected in a daisy chain can thus be configured from a single configuration source or have their configuration data read back while so connected.

20 Claims, 6 Drawing Sheets

CONFIGURING MULTIPLE PROGRAMMABLE LOGIC DEVICES WITH SERIAL PERIPHERAL INTERFACES

TECHNICAL FIELD

This invention relates generally to configuration of programmable logic devices and, more particularly, to configuration of multiple programmable logic devices connected in a daisy chain from a single configuration source.

BACKGROUND

Programmable logic devices (PLDs) are a well-known type of integrated circuit that can be programmed (configured) to perform logic functions. Examples of such devices are complex programmable logic devices (CPLDs) and field programmable logic arrays (FPGAs), such as the ECP family of devices from Lattice Semiconductor Corporation. Programming a PLD is accomplished by loading a configuration bitstream that may include configuration data, addresses, and/or commands into the PLD. Configuration circuitry within the PLD then directs the configuration data into configuration memory in the PLD in accordance with the commands. The bitstream is typically provided to the PLD by an external tester/programmer or by another semiconductor device such as a CPU or nonvolatile memory such as flash memory or EEPROM.

It is not unusual for a system board to contain a number of PLDs and for these PLDs to be programmed from a single configuration bitstream. A common technique for configuring such PLDs is to daisy chain the devices so that they are programmed one after another sequentially. Examples of this technique are disclosed in U.S. Pat. Nos. 7,397,272 and 7,554,357, which are incorporated by reference herein in their entirety. Conventional daisy chaining techniques, however, have a number of disadvantages. One drawback is that they do not work with PLDs that receive their bitstreams through serial peripheral interface (SPI) ports (i.e., interfaces). SPI is an industry standard protocol that is widely used in embedded systems for interfacing microprocessors and various devices such as sensors, memory chips and multimedia cards. See, for example, U.S. Pat. No. 7,570,078, which is incorporated by reference herein in its entirety. The SPI protocol, however, does not support daisy chaining slave SPI devices to one master SPI device, such as a CPU. Another drawback is that conventional daisy chaining techniques do not typically permit the PLDs in the chain to be configured or reconfigured in different sequences.

Alternative techniques to daisy chaining exist for programming multiple PLDs through their SPI ports using a single bitstream, although they also have disadvantages. One technique is to connect each PLD to a unique SPI port of the CPU. But this approach limits the number of connected PLDs to the number of SPI ports available on the CPU. Another technique is to connect the SPI port of the CPU to the SPI ports of multiple PLDs, with a demultiplexer inserted between the chip select pin of the CPU's SPI port and the chip select pins of each of the PLD's SPI ports. A general purpose IO signal from the CPU then controls the demultiplexer, allowing the CPU to individually select the PLDs for configuration. But this approach requires adding a demultiplexer to the system board, which increases the board's cost.

Accordingly, a need remains for a better technique for configuring multiple PLDS through their SPI ports from a single configuration source.

SUMMARY

According to one embodiment of the invention, a programmable logic device includes configuration memory; a serial peripheral interface (SPI) port for receiving a bitstream, the bitstream including at least commands; a chip select output pin for providing a chip select signal having a first logic state for selecting another device to receive the bitstream at an SPI port of the other device and a second logic state for de-selecting the other device; and configuration control circuitry coupled to the SPI port and the chip select output pin, the configuration control circuitry responsive to a command embedded in the received bitstream to drive the chip select output pin from the second logic state to the first logic state.

According to another embodiment of the invention, a method of configuring multiple programmable logic devices (PLDs) connected in a daisy chain includes providing first and second PLDs, each PLD including an SPI port for receiving for receiving a configuration bitstream to configure the PLD, the configuration bitstream including commands and configuration data; transmitting the configuration bitstream concurrently to the SPI ports of the first and second PLDs; and in response to a command embedded in the configuration bitstream received by the first PLD: stopping configuration data following the embedded command in the configuration bitstream from configuring the first PLD; and transmitting a chip select signal from the first PLD to the second PLD to select the second PLD for configuration with the configuration data following the embedded command.

Other embodiments of the inventions are, or course, possible. This summary is not intended to limit the invention to the above embodiments or to limit the scope of the claims.

DETAILED DESCRIPTION

The inventions disclosed herein are applicable to a wide variety of programmable logic devices (PLDs) such as CPLDs, FPGAs or other integrated circuits having programmable resources. As an example, an FPGA will be used to illustrate one or more embodiments of the invention. However, it should be understood that this is not limiting and that the invention may be implemented as desired, in accordance with one or more embodiments, with various types of PLDs.

In the following description, an embodiment of the invention is described to provide a thorough understanding of the invention. However, it should be apparent to one of ordinary skill in the art that the invention is not limited to the described embodiment. Moreover, well-known technical details about PLDs may be omitted from the description or presented only in abstract form to avoid needless complexity.

Figure 1:
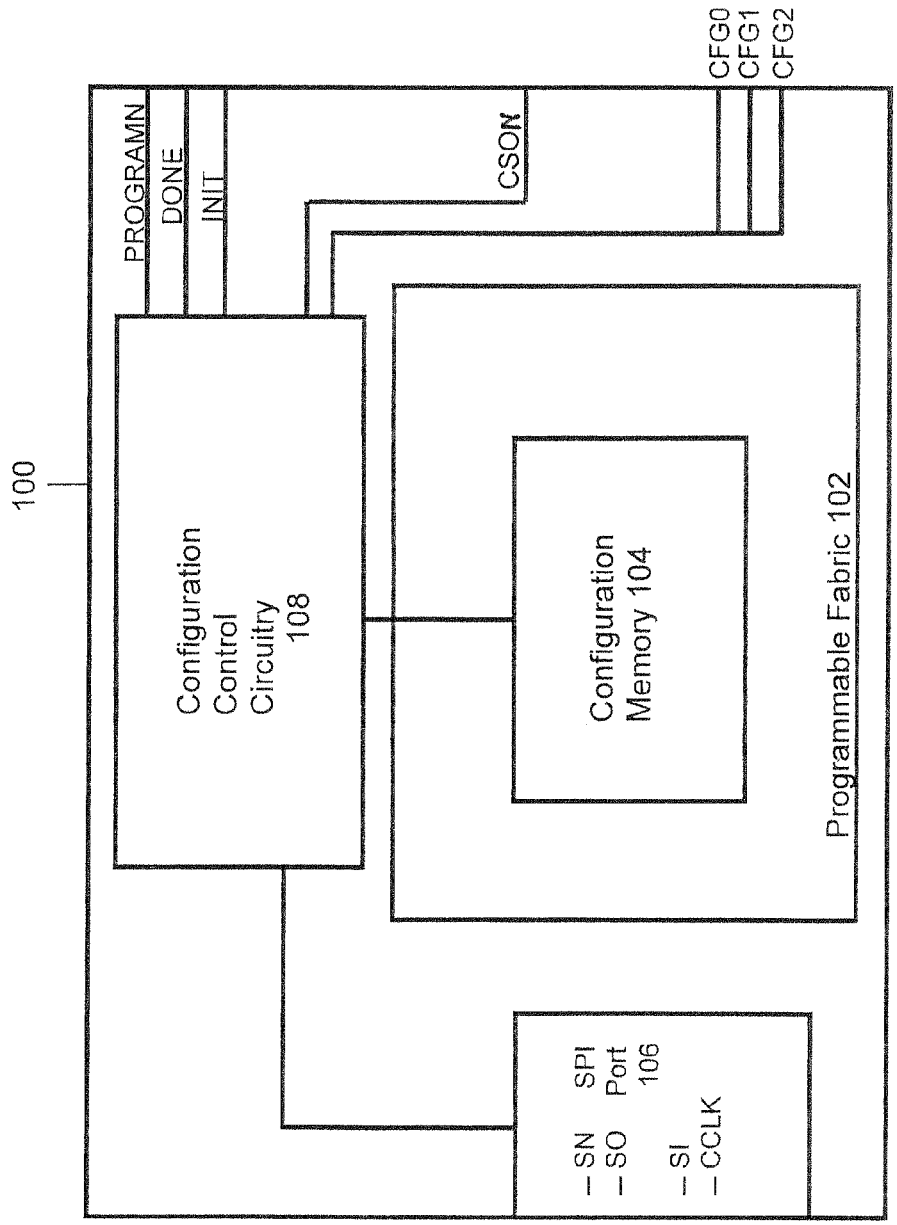
FIG. 1 is a functional block diagram of a programmable logic device according to one embodiment of the invention.

FIG. 1 shows a functional block diagram of a programmable logic device (PLD) 100 in the form of an FPGA in accordance with an embodiment of the invention. PLD 100 includes programmable I/O blocks, programmable logic blocks and programmable routing resources, which together form a programmable fabric 102 of the device. The I/O blocks provide I/O functionality (to support one or more I/O and/or memory interface standards) for PLD 100. The programmable logic blocks (also referred to in the art as configurable logic blocks or logic array blocks) provide logic functionality for PLD 100, such as for example LUT-based logic typically associated with FPGAs. The programmable routing resources interconnect the I/O blocks, logic blocks and other logic elements typically found within PLDs. These elements of the programmable fabric include volatile configuration memory 104 for configuring the elements. Although shown as a block for functional purposes, configuration memory 104 is typically distributed throughout PLD 100, such as in and between the I/O blocks, programmable logic blocks, and routing resources.

PLD 100 includes an I/O interface that may be configured to support various configuration options, or ports, for the device. Configuration of programmable logic devices is a well-known and documented process that is described in many publications such as "LatticeECP3 sysCONFIG Usage Guide," last published January 2010, which is incorporated herein by reference in its entirety. A copy of the publication is available in the application file and at www.latticesemi.com. The port configuration is determined by the logic states of signals applied to configuration pins CFG0-CFG2. One such configuration option is serial peripheral interface (SPI) port 106 operating in a slave SPI (SSPI) mode. In this configuration the SPI port uses the following pins of the I/O interface to handle four signals (the name of a pin will also be used for its signal, unless otherwise noted). SN is a chip select input pin that is active low. That is, the chip select signal has one logic state for selecting the PLD to receive a configuration bitstream (e.g., active low) and another logic state for de-selecting the PLD. SO is a serial data output pin. SI is a serial data input pin. And CCLK is a clock input pin. As will be described, the inventive SPI mode enables multiple PLDs to be configured from a single configuration source through their SPI ports using a daisy chain configuration.

Other configuration pins and signals of interest include PROGRAMN, INITN, DONE, and CSON. A high-to-low signal applied to PROGRAMN begins a configuration process for PLD 100. When the PROGRAMN pin is driven low, the INITN pin is driven low while the configuration control circuitry 108 within the PLD is reset. Once the initialization phase of the configuration process is complete, the INITN pin goes high. A low-to-high transition on INITN causes the pins CFG0-CFG2 to be sampled, signaling circuitry 108 which configuration mode is to be used. For example, a reading of binary 100 on pins CFG0-CFG2 indicates a slave SPI configuration mode in the present embodiment. The DONE pin indicates if PLD 100 has finished the configuration process. DONE goes low when INITN goes low. When INITN and PROGRAMN go high, and the internal DONE bit is programmed at the end of the PLD configuration, the DONE pin is released and internally goes high (being tied to a weak pull-up resister). This normally causes the PLD to begin the next phase of the configuration process, wake-up, in which PLD 100 moves toward user (functional) mode. However, the DONE pin can be held externally low to delay the wake-up sequence. This will allow for synchronizing the wake-up of multiple PLDs in a daisy chain, as will be described. CSON is a chip select output pin that provides a chip select signal. Like the chip select signal received by pin SN, the chip select signal provided by pin CSON is active low.

As shown in FIG. 1, configuration control circuitry 108 communicates with the pins described above, SPI port 106, and configuration memory 104 in configuring PLD 100. Configuration control circuitry 108 is similar to conventional control circuitry except that circuitry 108 has been adapted to respond uniquely to a certain command embedded in a configuration bitstream when PLD 100 is placed in a specific configuration mode. As part of the configuration process, SPI port receives a configuration bitstream from a configuration source (such as a CPU) to configure the memory 104. The configuration bitstream includes various configuration commands and configuration data. The chip select output pin CSON provides a chip select output signal having a first logic state (e.g., low) for selecting another device to receive the configuration bitstream at an SPI port of the other device and a second logic state (e.g., high) for de-selecting the other device. Configuration control circuitry 108 responds to the certain command embedded in the received configuration bitstream to drive CSON from high to low. In this embodiment, the configuration control circuitry also responds to the embedded command by stopping configuration data following the embedded command in the configuration bitstream from configuring the configuration memory.

Figure 2:
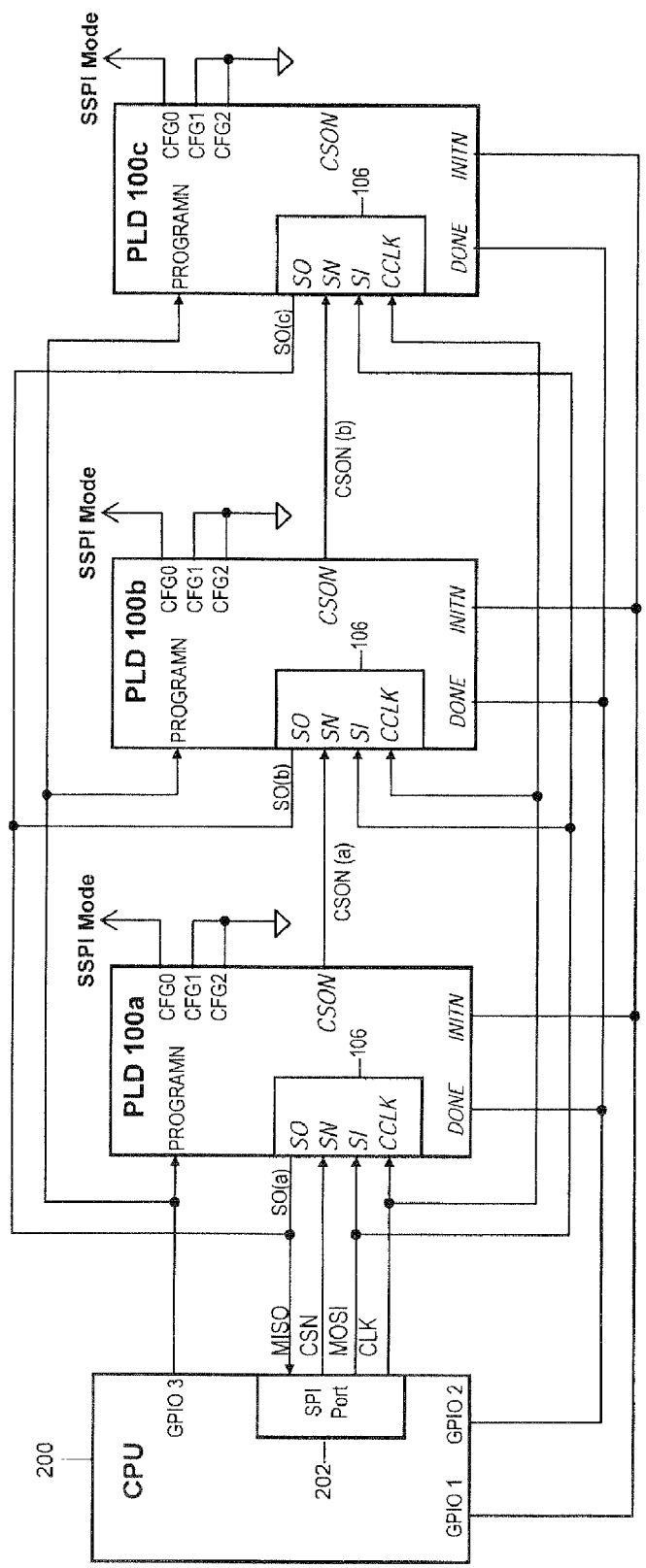
FIG. 2 shows several programmable logic devices of FIG. 1 connected in a daisy chain for configuration from a single configuration source.

FIG. 2 shows several PLDs 100a, 100b, and 100c connected together in a daisy chain for configuration according to one embodiment of the invention. The daisy chain could, of course, contain more PLDs if desired. The configuration source for the PLDs is a central processing unit (CPU) 200 that includes a master SPI port 202 and a number of general purpose I/O (GPIO) pins GPIO1-GPIO3. SPI port 202 in turn includes pins that provide a chip select output signal CSN; serial data output signal MOSI; serial data input signal MISO; and clock output signal CLK. As indicated in the figure, the PROGRAMN, DONE, and INITN pins of the PLDs 100a-100c are coupled together, respectively, to GPIO pins of CPU 200. For example, the DONE pins of PLDs 100a-100c are coupled together to the GPIO2 pin of the CPU. As also indicated in the figure, three of the pins within the SPI ports 106 of PLDs 100a-100c are coupled together to pins within SPI port 202 of CPU 200. In particular, the SO pins of the PLDS are coupled together to the MISO pin of the CPU. The SI pins of the PLDs are coupled together to the MOSI pin of the CPU, and the CCLK pins of PLDs are coupled together to the CLK pin of the CPU. Completing the connections in the daisy chain, the SN pin of PLD100a is coupled to the CSN pin of CPU 200. The SN pin of PLD 100b is coupled to the CSON pin of PLD100a. And the SN pin of PLD100c is coupled to the CSON pin of PLD 100b. The configuration pins CFG0-CFG2 of each PLD are set to binary 100 to indicate the SSPI configuration mode for the PLDs. In this slave configuration mode, CPU 200 is the source of the clock signal and the PLDs are recipients of the clock signal.

Figure 3:
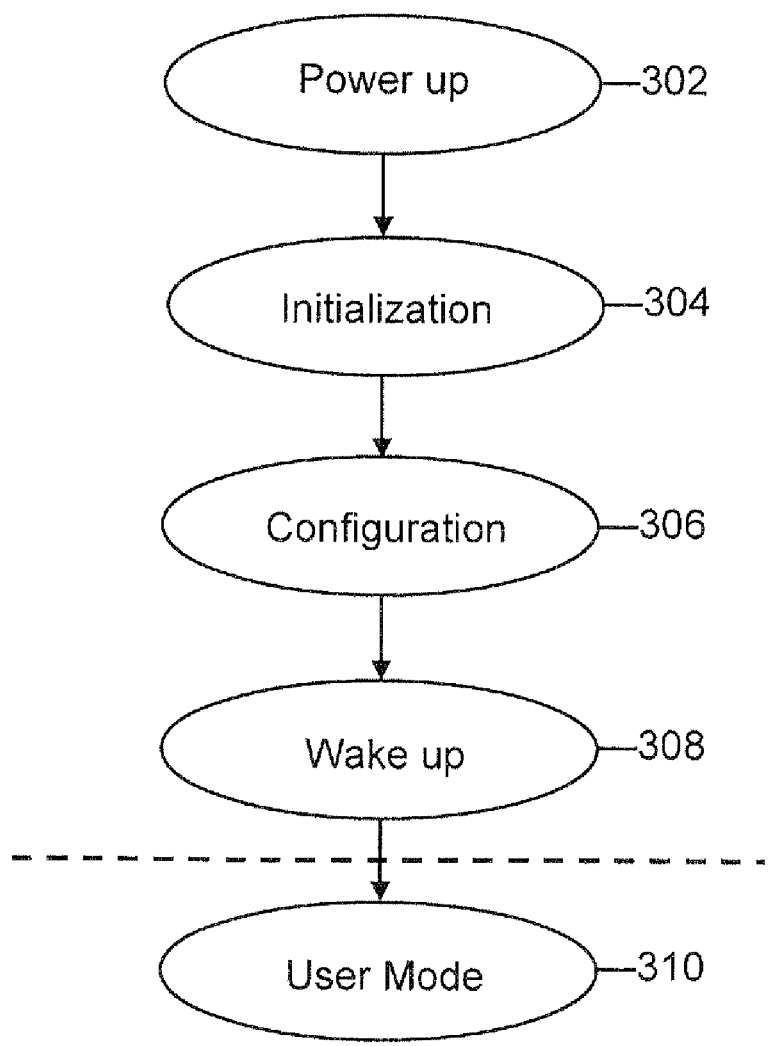
FIG. 3 is a flowchart of a process for configuring the programmable logic devices of FIG. 2.

FIG. 3 is a flowchart of a process for configuring the programmable logic devices of FIG. 2 in accordance with an embodiment of the invention. Prior to entering user (functional) mode and becoming operational, each of the PLDs 100a-100c goes through a sequence of phases, including initialization, configuration, and wake-up. On power up 302, each of PLDs 100a-100c drives its CSON pin and SN pin high (effectively de-selecting the PLD). The PROGRAMN pin is driven low by CPU 200, and the INITN and DONE pins are also driven low internally. The PLDs then enter initialization 304, which includes resetting their configuration control circuitry 108 and clearing their configuration memory 104. As part of the initialization each PLD samples its configuration pins CFG0-CFG2 to determine the configuration mode selected for the configuration phase.

Figure 4:
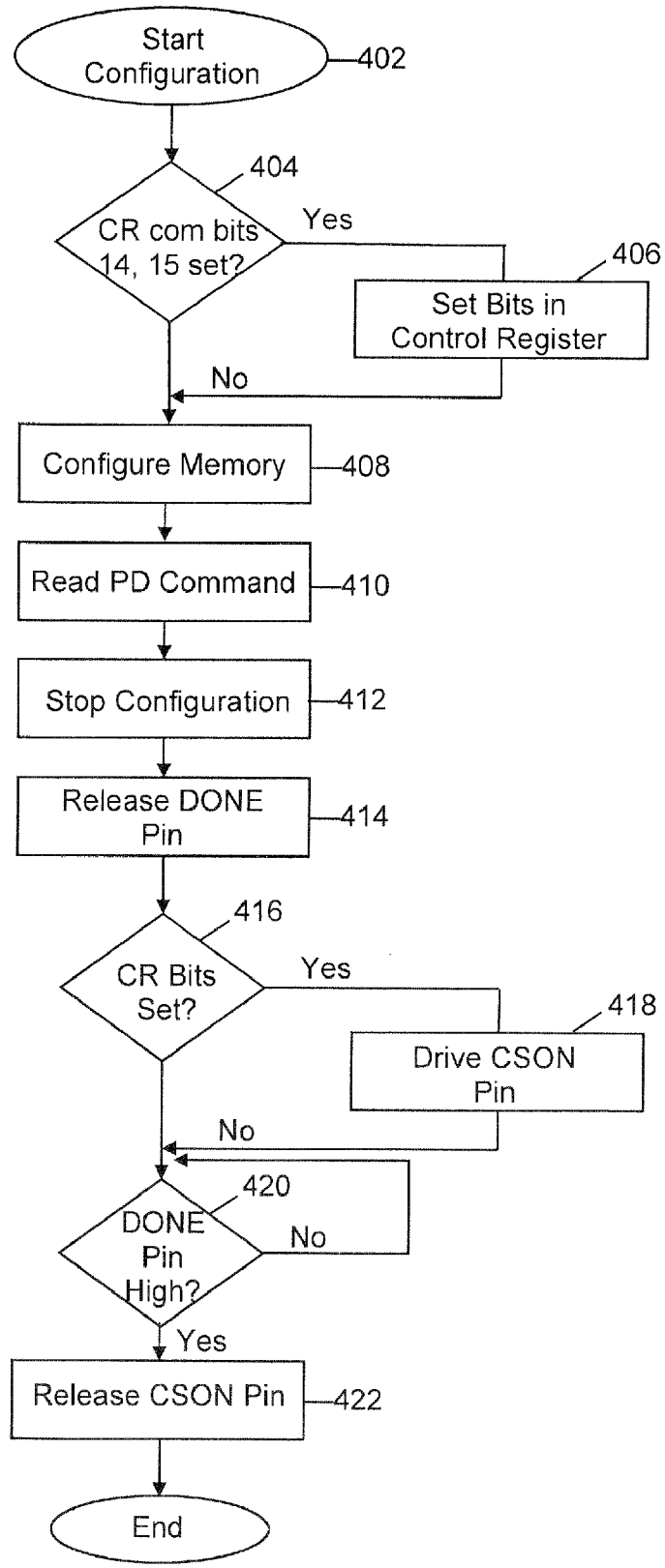
FIG. 4 is a flowchart of the configuration phase of the configuration process of FIG. 3
Figure 5:
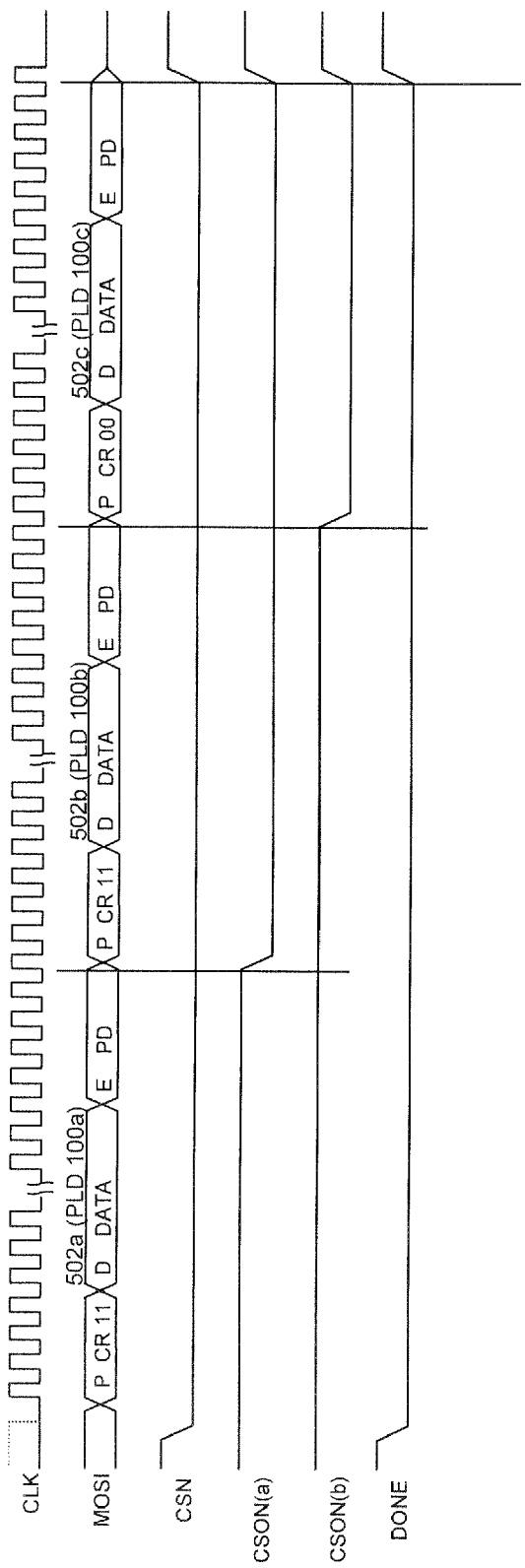
FIG. 5 is a waveform diagram showing changes in relevant signals during configuration phase of FIG. 4.

The configuration phase 306 begins once the initialization phase is complete. FIG. 4 is a flowchart that shows the configuration phase in the present embodiment as a series of steps. The steps are shown sequentially for purposes of explanation, but the actions they represent may occur as combined actions or in a different order depending upon the embodiment of the invention. FIG. 5 is a waveform diagram that shows changes in relevant signals that occur during this phase. At step 402 a configuration bitstream represented by the signal MOSI (master output, slave input) is provided concurrently by CPU 200 from the MOSI pin of the CPU to the SI pin of each PLD 100a-100c. CPU 200 also supplies a clock signal (CLK) from its CLK pin to the CCLK pin of each of the PLDs. CSN goes low, driving the SN pin of PLD 100a low to select the PLD for configuration. Note that CSON(a) and CSON(b) remain high, keeping the SN pins on PLD 100b and 100c high and these PLDs de-selected. The DONE signal to GPIO2 (which is a combination of the DONE signals from the individual PLDs) also goes low as configuration begins and will remain low until all of the PLDs 100a-100c are configured.

The configuration bitstream received by the PLDs may include a number of frames each including various data and commands depending on the particular format desired, as is known in the art. In FIG. 5 only data and commands in the bitstream necessary for understanding of the invention are shown. The bitstream includes three concatenated portions 502a-502c, one for each PLD 100a-100c as indicated in the figure. Each portion has a preamble section P, a data section D, and an end section E. Section P includes a command (CR) in which bits 14 and 15 control the setting for two corresponding bits in a control register (not shown) within configuration control circuitry 108. In section P of bitstream portions 502a and 502b, bits 14 and 15 are set (e.g., 11). However, in section P of bitstream portion 502c, bits 14 and 15 are not set (e.g., 00). In all bitstream portions 502a-502c, section D contains configuration data (DATA) for configuration memory 104 and section E contains a Program_Done (PD) command. As described below, the CR commands in portions 502a-502b cause the configuration control circuitry in PLDs 100a and 100b to respond differently to the PD command than the configuration control circuitry in PLD 100c.

With the CS pin on PLD 100a driven low, the PLD receives in section P the CR command with bits 14 and 15 set (step 404, FIG. 4). This causes the two corresponding bits in the control register within circuitry 108 to be set (step 406). The configuration data (DATA) follows in section D, and the configuration control circuitry configures the configuration memory with the received data (step 408). Following the configuration data, the configuration circuitry receives and reads the PD command in section E (step 410). The configuration circuitry responds to the PD command by stopping further configuration of configuration memory 104 with data that follows the PD command (step 412) and also releases the DONE pin internally to indicate that PLD 100a is configured (step 414). Reflecting the influence of the two bits set in the control register (step 416), circuitry 108 also responds to the PD command by driving the chip select signal CSON(a) low (step 418). This action drives the SN pin on adjacent PLD 100b low and selects that PLD to be configured next in the chain. Although released, the DONE pin of PLD 100a remains low (step 420). As noted above, this is because the DONE pins of the three PLDS are tied together and the DONE pins of PLD 100b and 100c are still tied low at this point in the configuration phase. It will remain low until all PLDs in the chain release their DONE pins, at which point the DONE pin goes high (step 422).

The configuration of PLD 100b proceeds in the same way as the configuration of PLD100a because bitstream section P of portion 502b also contains a CR command with bits 14 and 15 set. With configuration of memory 104 complete, circuitry 108 in PLD 100b drives its chip select signal CSON(b) low and releases its DONE pin. This action drives the SN pin on adjacent PLD 100c low and selects that PLD to be configured next in the chain. Again, although released, the DONE pin of PLD 100b remains low because the DONE pins of the three PLDS are tied together and the DONE pin of PLD 100c is still tied low at this point in the configuration phase.

The configuration of PLD 100c is slightly different because in bitstream section P of portion 502c bits 14 and 15 of the CR command are not set (step 404). Consequently, the two bits are not set in the control register of circuitry 108 (no step 406), and circuitry 108 does not drive its CSON pin low (no step 418). Circuitry 108 releases its DONE pin (step 414). With the DONE pins of all three PLDs released, the DONE pins go high (step 420) and this combined signal is transmitted to GPIO 2 of CPU 200. As shown in FIG. 5, this change in the DONE signal has two effects. It causes the control circuitry 108 in PLDs 100a and 100b to release their CSON pins, causing CSON(a) and CSON(b) to go high (step 422). It also causes CPU 200 to release its CSN pin, causing the CSN signal to PLD 100a to go high. The SN pins on PLDs 100a-100b then rise in response, indicating that the PLDs are no longer selected for configuration.

Referring again to FIG. 3, following the configuration phase the PLDs 100a-100c proceed through a conventional wake up phase (step 308) to complete the configuration process. The PLDs 100a-100c then enter user (functional) mode (step 310).

Although in the above-described embodiment the PLDs in the daisy chain were configured sequentially, this is not required. For example, by placing commands in different portions of the bitstream and by using commands known in the art such as the Flow_Through (FT) command, PLD 100b can be configured (or reconfigured) without configuring PLD100a before configuring PLD 100a.

Figure 6:
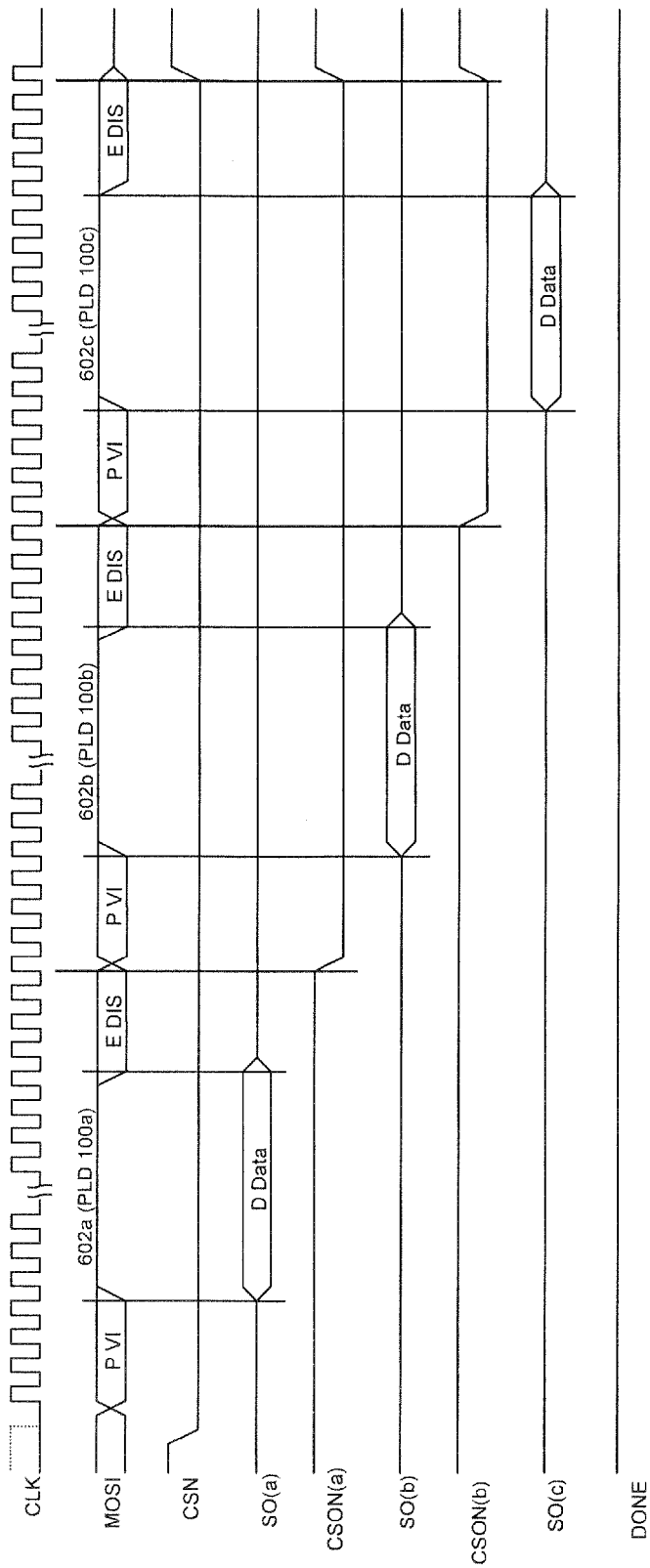
FIG. 6 is a waveform diagram showing changes in relevant signals during a read back of the configuration data from the programmable logic devices of FIG. 2.

The above-described embodiment also supports CPU 200 reading back the configuration data in PLDs 100a-100c when they are connected in the daisy chain of FIG. 2. After the PLDs wake up and are in user mode, they may be read back through their SPI ports 106 as follows. With reference to FIG. 6, a read back command referred to herein as Verify_Increment (VI) command is issued by CPU 200 to PLD 100a in section P of portion 602a of a bitstream that contains no configuration data (i.e., no section D). PLD 100a responds by providing the configuration data through its SO(a) pin to the MISO pin of the CPU. After the data has been read back, CPU 200 issues a DISABLE command to PLD 100a in section E of portion 602a. With control registers bits 14 and 15 set, PLD 100a responds to the DISABLE command by driving the CSON(a) pin low (active), tri-stating the SO(a) pin, and ignoring further commands or data received at its SI pin from the CPU, such as another VI command. As indicated in FIG. 6, CPU 200 reads back the configuration data from the PLDs 100b and 100c in the same manner. Once CPU 200 has read back all of the data, it drives the CSN pin high. A high signal on the CSN pin de-selects PLD 100a, which causes the PLD to release the CSON(a) pin. CSON(a) then goes high, de-selecting PLD 100b, which causes the PLD to release the CSON(b) pin. CSON(b) then goes high, de-selecting PLD 100c. The PLDs are then again in user mode.

The embodiments described above are intended to illustrate but not limit the invention. For example, it should be understood that other embodiments are contemplated by the present disclosure and that numerous modifications and variations to the described embodiments are possible in accordance with the principles of the invention. No limitations from the specification are intended to be read into any claim unless those limitations are expressly included in the claim. Accordingly, it is applicants' intent that the scope of the following claims be defined only by the language of the claims.

The invention claimed is:

1. A programmable logic device (PLD) comprising:
   configuration memory;
   a serial peripheral interface (SPI) port for receiving a bitstream, the bitstream including at least commands;
   a chip select output pin for providing a chip select signal having a first logic state for selecting another device to receive the bitstream at an SPI port of the other device and a second logic state for de-selecting the other device; and
   configuration control circuitry within the PLD coupled to the SPI port and the chip select output pin, the configuration control circuitry responsive to a command embedded in the received bitstream to drive the chip select output pin from the second logic state to the first logic state.

2. The PLD of claim 1, wherein the configuration control circuitry is also responsive to the embedded command to stop the PLD from responding to a read back command following the embedded command in the bitstream.

3. The PLD of claim 1, wherein the bitstream is a configuration bitstream, and the SPI port is adapted to receive a configuration bitstream that includes configuration data for configuring the configuration memory.

4. The PLD of claim 3, wherein the configuration control circuitry is also responsive to the embedded command to stop configuration data following the embedded command in the configuration bitstream from configuring the configuration memory.

5. The PLD of claim 1, wherein the SPI port includes a chip select input pin for receiving a chip select signal having a first logic state for selecting the PLD to receive the bitstream and a second logic state for de-selecting the PLD.

6. The PLD of claim 1, wherein the SPI port is a slave SPI port that includes a chip select input pin to receive a chip select signal and the bitstream from a master SPI port of a CPU.

7. The PLD of claim 1, wherein the other device is another PLD.

8. The programmable logic device of claim 1, including:
   a plurality of configuration pins for receiving configuration signals that set a configuration mode for the device, one of the configuration modes being an SPI configuration mode,
   wherein the configuration control circuitry is coupled to the configuration pins and responsive to the configuration control signals.

9. Programmable logic devices comprising:
   a first programmable logic device (PLD) including:
      configuration memory;
      a serial peripheral interface (SPI) port for receiving a bitstream, the bitstream including at least commands;
      a chip select output pin for providing a chip select signal having a first logic state for selecting a second PLD to receive the bitstream at an SPI port of the second PLD and a second logic state for de-selecting the second PLD; and
      configuration control circuitry within the PLD coupled to the SPI port and the chip select output pin, the configuration control circuitry responsive to a command embedded in the received bitstream to drive the chip select output pin from the second logic state to the first logic state; and
   a second PLD including:
      configuration memory;
      a serial peripheral interface (SPI) port for receiving a bitstream to configure the second PLD, the bitstream including at least commands;
      a chip select input pin for receiving a chip select signal having a first logic state for selecting the second PLD to receive the bitstream at the SPI port of the second PLD and a second logic state for de-selecting the second PLD; and
      configuration control circuitry within the PLD coupled to the SPI port, the configuration control circuitry responsive to the received bitstream.

10. The PLDs of claim 9, wherein the chip select input pin of the second PLD is coupled to receive a chip select signal from the chip select output pin of the first PLD.

11. The PLDs of claim 9 including a CPU having an SPI port, wherein the first PLD is coupled to receive the bitstream from the SPI port of the CPU, and the second PLD is coupled to receive a chip select signal from the first PLD and the bitstream from the SPI port of the CPU.

12. A method of configuring multiple programmable logic devices (PLDs) connected in a daisy chain, the method comprising:
   providing first and second PLDs, each PLD including an SPI port for receiving a configuration bitstream to configure the PLD, the configuration bitstream including commands and configuration data;
   transmitting the configuration bitstream concurrently to the SPI ports of the first and second PLDs; and
   in response to a command embedded in the configuration bitstream received by the first and second PLDs:
      stopping from within the first PLD configuration data following the embedded command in the configuration bitstream from configuring the first PLD; and
      driving from within the first PLD a chip select signal from the first PLD to the second PLD to select the second PLD for configuration with the configuration data following the embedded command.

13. The method of claim 12, wherein the configuration bitstream contains first configuration data followed by the embedded command followed by second configuration data, the method including configuring the first PLD with the first configuration data before responding to the embedded command.

14. The method of claim 13, including configuring the second PLD with the second configuration data after responding to the embedded command.

15. The method of claim 12, wherein the first PLD generates the chip select signal transmitted from the first PLD to the second PLD.

16. The method of claim 12, wherein the chip select signal is transmitted by the first PLD from a chip select output pin of the first PLD to a chip select input pin of the second PLD.

17. The method of claim 12 including, before the embedded command in the configuration bitstream is received by the first PLD:

transmitting a chip select signal to the first PLD to select the first PLD for configuration by configuration data preceding the embedded command; and transmitting a chip select signal from the first PLD to the second PLD to de-select the second PLD for configuration by the preceding configuration data.

18. The method of claim 17, wherein:

the chip select signal for the first PLD is transmitted to a chip select input pin of the first PLD; and the chip select signal for the second PLD is transmitted by the first PLD from a chip select output pin of the first PLD to a chip select input pin of the second PLD.

19. The method of claim 12, including:

before transmitting the configuration bitstream to the PLD, determining from the configuration signals sent to the PLD that the PLD is in an SPI configuration mode.

20. A method of reading back configuration data from multiple programmable logic devices (PLDs) connected in a daisy chain, the method comprising:

providing first and second PLDs, each PLD including an SPI port for receiving for receiving a bitstream that includes at least one command, wherein a chip select output pin of the first PLD is coupled to a chip select input pin of the second PLD;

transmitting a chip select signal to a chip select input pin of the first PLD but not to the chip select input pin of the second PLD;

transmitting the bitstream concurrently to the SPI ports of the first and second PLDs; and in response to at least one command embedded in the bitstream received by the first and second PLDs:

transmitting configuration data in the first PLD to be read back;

stopping the first PLD from responding to a read back command following the at least one embedded command in the bitstream; and driving from within the first PLD a chip select signal from the chip select output pin of the first PLD to the chip select input pin of the second PLD to select the second PLD, wherein the second PLD once selected responds to the read back command following the at least one embedded command in the bitstream.

\* \* \* \* \*